(12) United States Patent
Nys et al.

(10) Patent No.: US 10,469,115 B2
(45) Date of Patent: *Nov. 5, 2019

(54) PROXIMITY SENSOR WITH NONLINEAR FILTER AND METHOD

(71) Applicant: Semtech Corporation, Camarillo, CA (US)

(72) Inventors: Olivier Nys, Neuchâtel (CH); Chaouki Rouaissia, Neuchâtel (CH)

(73) Assignee: Semtech Corporation, Camarillo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/375,470

(22) Filed: Apr. 4, 2019

(65) Prior Publication Data

US 2019/0229762 A1   Jul. 25, 2019

Related U.S. Application Data

(63) Continuation of application No. 15/962,761, filed on Apr. 25, 2018, now Pat. No. 10,298,280.

(60) Provisional application No. 62/511,576, filed on May 26, 2017.

(30) Foreign Application Priority Data

May 12, 2017   (EP) .................................. 17170848
May 16, 2017   (EP) .................................. 17171258

(51) Int. Cl.
*H03K 17/955* (2006.01)
*G06F 3/041* (2006.01)
*G01V 3/08* (2006.01)
*H04B 1/3827* (2015.01)
*H03K 17/96* (2006.01)

(52) U.S. Cl.
CPC ............. *H04B 1/3838* (2013.01); *G01V 3/08* (2013.01); *G06F 3/0416* (2013.01); *H03K 17/955* (2013.01); *H03K 17/962* (2013.01); *H04M 2250/12* (2013.01)

(58) Field of Classification Search
CPC ....... H03K 17/955; G06F 3/0416; G01V 3/08
See application file for complete search history.

(56) References Cited

U.S. PATENT DOCUMENTS

| | | |
|---|---|---|
| 4,970,637 A | 11/1990 | Sato |
| 5,319,583 A | 6/1994 | Wildes |
| 9,204,796 B2 | 12/2015 | Tran |
| 2010/0097133 A1 | 4/2010 | Philipp et al. |

(Continued)

FOREIGN PATENT DOCUMENTS

EP   3106970 A1   12/2016

OTHER PUBLICATIONS

European Search Report for EP Application No. 18169067.8, dated Aug. 23, 2018, 10 pages.

*Primary Examiner* — Asghar H Bilgrami
(74) *Attorney, Agent, or Firm* — Blank Rome LLP

(57) ABSTRACT

A sensor for a portable connected device comprising a filter 30 is arranged to reduce a noise component on a sampled input signal, wherein the filter is arranged to consider only input measurements that change systematically in a same direction, updating an output value when all the input samples in a predetermined time window are above or below a current output value and, repeating the current output value when the input samples in the time window are below and above the current output value.

10 Claims, 3 Drawing Sheets

(56) References Cited

U.S. PATENT DOCUMENTS

2015/0068069 A1 3/2015 Tran
2017/0090609 A1 3/2017 Petrovic et al.

PROXIMITY SENSOR WITH NONLINEAR FILTER AND METHOD

REFERENCE DATA

The present application is a continuation of U.S. patent application Ser. No. 15/962,761, filed on Apr. 25, 2018, which claims benefit of priority of U.S. provisional patent application 62/511,576 filed May 26, 2017, of European Patent Application EP17171258.1 filed May 16, 2017, and of European Patent Application EP17170848.0 filed May 12, 2017, all in the name of Semtech Corporation. The entire contents of these applications are hereby incorporated by reference.

FIELD OF THE INVENTION

The present invention concerns a processor for processing the output of a proximity sensor, and to a smart proximity sensor that is combined with a processor that is arranged to output a signal that discriminates between the proximity to a human body and the proximity to an inanimate object. The present invention is concerned in particular, but not exclusively, with a connected portable device that is equipped with such a smart proximity sensor and is arranged to adapt the RF emitted from a radio interface in order to maintain a Specific Absorption Rate (SAR) within given limits.

DESCRIPTION OF RELATED ART

Capacitive proximity detectors are used in many modern portable devices, including mobile phones and tablets, to determine whether the device is close to a body part of a user. This information is important in several ways: it is used to detect whether the telephone is being actively manipulated by a user, and whether the user is looking at the display, in which case the information displayed can be adapted, and/or the device switch from a low power state to an active one. Importantly, this information is used to adapt the power level of the radio transmitter to comply with statutory SAR limits. Capacitive proximity detection is used also in touch-sensitive displays and panels.

Known capacitive sensing systems measure the capacity of an electrode and, when the device is placed in proximity of the human body (for example the hand, the head, or the lap) detect an increase in capacity. The variations in the sensor's capacity are relatively modest, and often amount to some percent of the "background" capacity seen by the sensor when no conductive body is in the proximity. Known capacitive detection systems may include a digital processor for subtracting drift and noise contributions and deliver a digital value of the net user's capacity in real time and/or a digital binary flag indicating the proximity status based on a programmable threshold.

BRIEF SUMMARY OF THE INVENTION

It is therefore an aim of the present invention to provide a discrimination method for inanimate object in a capacitive proximity detector that overcomes the above limitation.

BRIEF DESCRIPTION OF THE DRAWINGS

The invention will be better understood with the aid of the description of an embodiment given by way of example and illustrated by the figures, in which.

Figure 2:
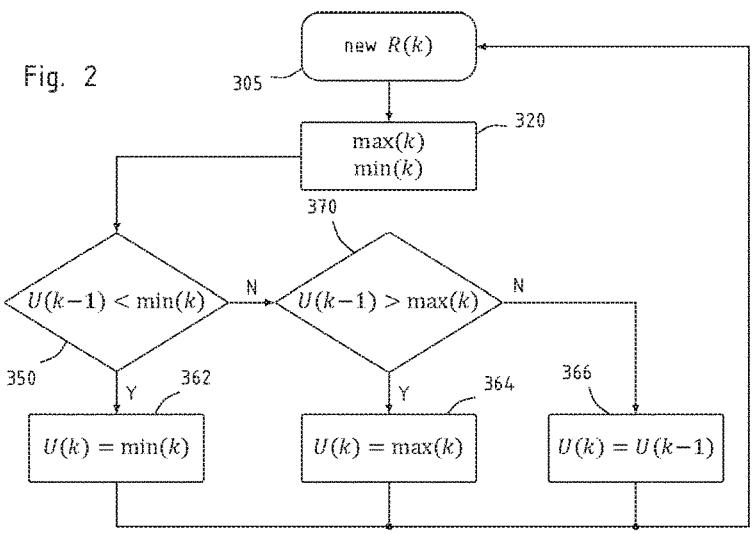
Figure 3:
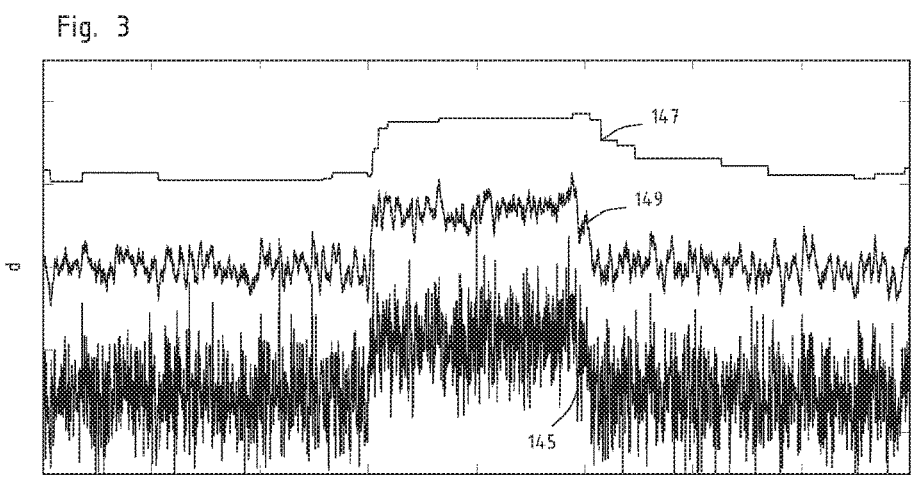
Figure 4:
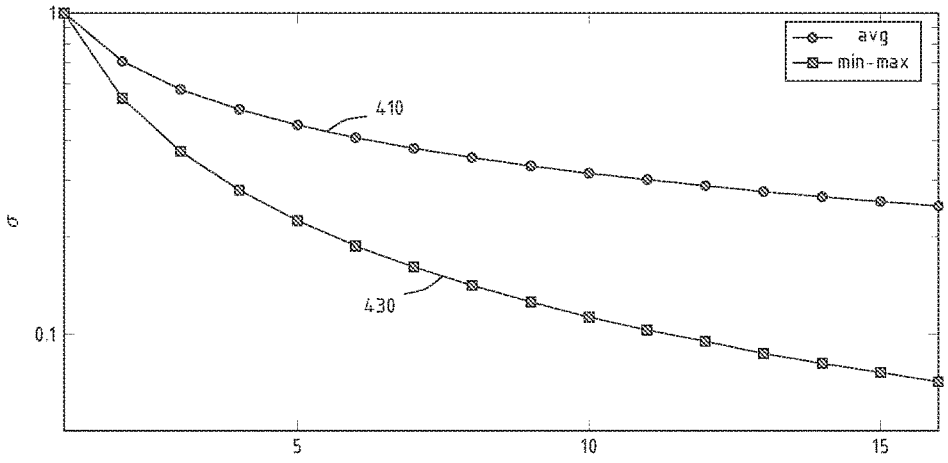
Figure 5:
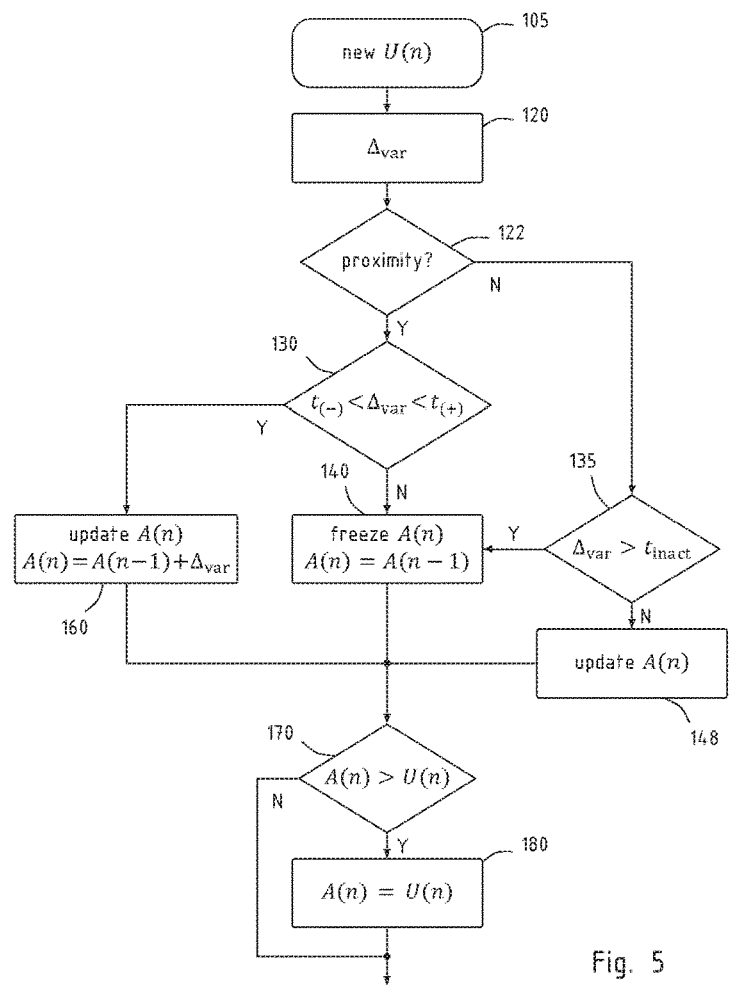
Figure 6:
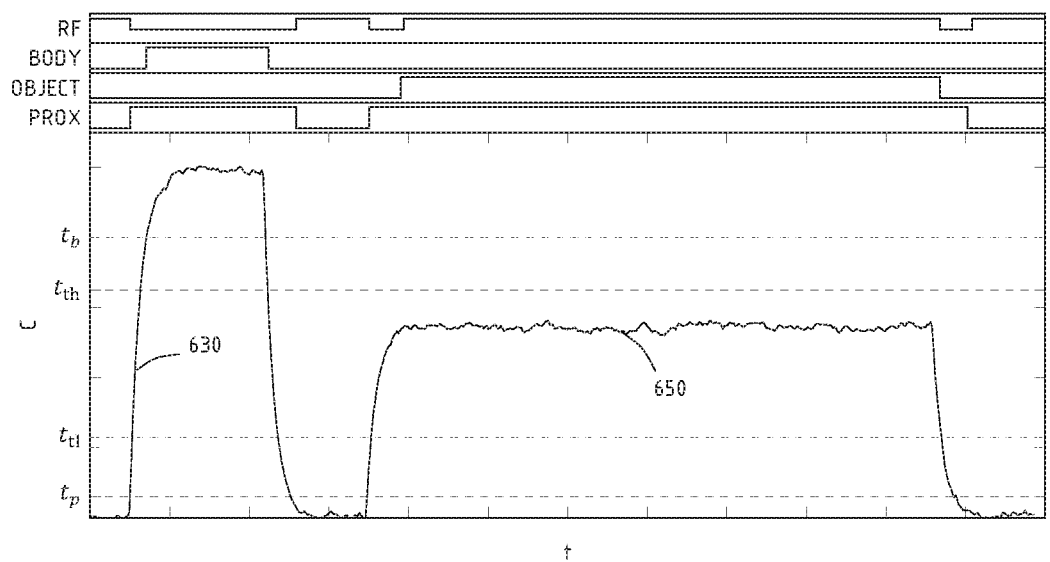

The flowchart of FIG. 2 describes a nonlinear filtering method;

FIG. 3 plots a noisy signal processed by a running average filter and by a nonlinear filter;

FIG. 4 plots the standard deviation in relation to the filter window size;

FIG. 5 is a flowchart describing an optional baseline estimation method;

FIG. 6 illustrates an optional multiple-threshold discrimination method;

DETAILED DESCRIPTION OF POSSIBLE EMBODIMENTS OF THE INVENTION

Figure 1:
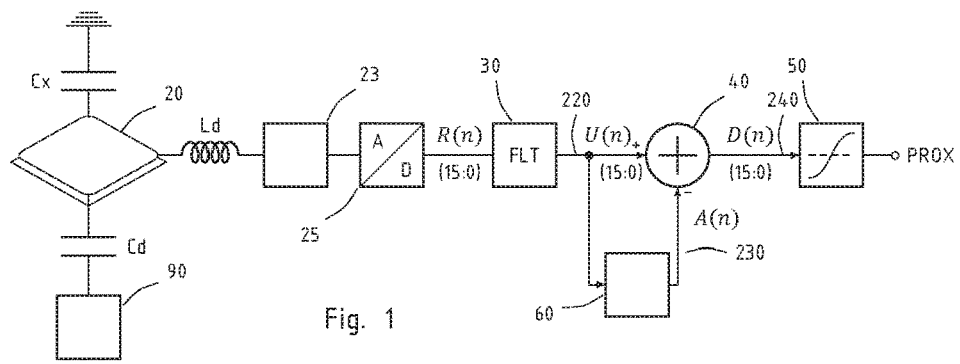
FIG. 1 illustrates schematically a capacitive proximity sensor in a portable connected device.

FIG. 1 shows schematically a capacitive proximity detector in a connected portable device such as a portable phone, laptop computer, or tablet, but it should be understood that the filter and the method of the invention could be applied to diverse fields.

The detector is sensitive to the capacity Cx of an electrode 20 that will increase slightly at the approach of a user's hand, face or body. The variations due to body proximity are overshadowed by the own capacity of the electrode 20 which, in turn, is not stable. The capacity signal is preferably amplified and processed by an analogue processor 23, which may also subtract a programmable offset, and converted into raw digital values by an A/D converter 25. The samples R(n) may be encoded as 16 bits integers, or in any other suitable format.

The raw samples R(n) contain also, in a non-ideal world, noise and unwanted disturbances that are attenuated by a filter 30. The filter 30 which will be described more in detail in the following, provides a series of samples U(n) useful for the processing in the successive stages.

The unit 60 is a baseline estimator that generates a series of samples A(n) that approximate the instantaneous value of the baseline, considering drift. This is then subtracted from the U(n) samples in difference unit 40 and provides the drift-corrected samples D(n). A discriminator unit 50 then generates a binary value 'PROX' that indicates the proximity of the user's hand, face, or body. The invention is not limited to a binary output, however, and encompasses detectors that generate multi-bit proximity values as well.

In an optional variant of the invention, the baseline estimator 60 includes a drift compensation unit arranged to track and subtract a drift from the proximity signal generating a drift-compensated signal by: measuring a variation of the proximity signal in a determined time interval, freezing the tracking of the drift when the logical PROX value is asserted and the variation is not in a predetermined acceptance region, or the variation is in a predetermined freezing region, as represented in FIG. 5.

An important aspect of the method of the invention is (step 120) the estimation of the variation of the useful signal $U_n$. The variation is represented by a quantity $\Delta_{var}$ that is preferably computed at each new useful sample $U_n$ (step 105). A possible manner of estimating the variation of $U_n$ is the difference between a sample and the preceding one, $\Delta\_var=U_n-U_{n-1}$ or preferably, a running average of the differences $U_n-U_{n-1}$ in a suitable window, for example the last eight received samples of $U_n$. $\Delta_{var}$, however, could denote any other suitable estimator of the variation.

At step 122 the method of the invention checks whether the proximity signal is active, i.e. whether there are indications that a conductive body is nearby. If the result of this test is positive, the method tests (step 130) whether the variation $\Delta_{var}$ is in a predetermined region of acceptance. In the example, $\Delta_{var}$ is compared with a lower threshold t(−), which may be negative, and an upper threshold t(+) that will be, in most cases, positive.

If the variation is in the region of acceptance, the method of the invention treats it as a drift, and updates the baseline estimation to track it (step 160). The new value for $A_n$ could be computed by adding to the previous one the value of the variation $\Delta_{var}$, or in any other manner.

If, on the other hand, the variation $\Delta_{var}$ is not in the predetermined region of acceptance (t(−),t(+)) the method of the invention treats it as a movement of the phone and/or of the user and not as a drift. In step 140, the previous value of the baseline estimation, $A_{n-1}$ is copied into the new one $A_n$. In this manner, the baseline estimation $A_n$ is frozen to a constant value.

Optionally, as shown in this example, the baseline estimation $A_n$ can be frozen based on the variation $\Delta_{var}$ also when the proximity signal is not active. This is the case of the example shown where, at step 135, the variation $\Delta_{var}$ is compared with another threshold value $t_{inact}$. If the variation exceeds this value, the baseline estimation is frozen (step 140), otherwise the value of $A_n$ is updated based on the samples ($U_n$, $U_{n-1}$, ... ) in any suitable manner 6 (step 148). In a possible implementation, $A_n$ may be set equal to $U_{n-1}$, or to an average of past $U_n$ samples.

Optional steps 170 and 180 prevent that the value $A_n$ exceeds that of $U_n$, thereby ensuring $D_n>0$.

Should the capacitive proximity sensor be part of a connected portable device for SAR control, the sensor electrode 20 will preferably be placed close to the transmitting antenna of the RF transmitter, to determine accurately the distance from the radio source. The sensor electrode 20 could be realized by a conductor on a printed circuit board or on a flexible circuit board, and may have guard electrodes on the back and at the sides, to suppress detection of bodies and objects at the back or on the sides of the device.

In the same application, the capacitive electrode could serve also as RF antenna, or part thereof. FIG. 1 shows this feature of the invention. The electrode 20 is connected, through a decoupling capacitor Cd, to a radio transmitter and receiver unit 90, and has an inductor Ld, or another RF-blocking element, to block the radiofrequency signal. Otherwise, the radio unit 90 could be connected to an antenna separate and independent from the sense electrode 20 which, in this case, could be connected directly to the analogue interface 23 without the decoupling inductor Ld.

FIG. 6 illustrates another optional variant of the invention, in which the capacitance may be detected as a function of time when the detector approaches a body (peak 630) and then an inanimate object (peak 650). In the discriminator 50 the capacity signal is compared with four threshold values: $t_p$ is the lowest and corresponds to a value that, when it is not exceeded indicates sufficient distance from any body part that the transmitter can operate at full RF power. The highest threshold $t_b$ indicates, when it is surpassed, that the antenna is very likely close to a body part, and the power must be reduced. The intermediate thresholds $t_{tl}$ and $t_{th}$ delimit a band of values that may be produced either by a body part or an inanimate object and, in this band, a decision is taken based on the variation of the signal. According to an aspect of the invention, when the capacity is comprised between $t_{tl}$ and $t_{th}$ the discriminator unit checks the variation of the capacity over time and determines whether the capacitance signal is stable. Stability can be judged for example by verifying that the maximum and minimum of the signal within a determined time window are not more separate than a given value, or in any other suitable way.

The detector of the invention may generate the following logical signals conventionally denoted by PROX, BODY, and OBJECT:

PROX, set when $C>t_p$ This correspond to the logical flag generated when the discriminator unit 50 of FIG. 2 is a conventional discriminator;

BODY, set when $C>t_b$.

OBJECT, set when $t_{tl}<C<t_{th}$ and C is stable.

The power of the RF transmitter is determined in consideration of these flags and, in particular, the flag TABLE is used as an indicator that the object that has raised the capacity is inanimate, and the power need not be reduced. In a possible implementation, if the trigger levels $t_p,t_b,t_{tl},t_{th}$ are in the order represented in FIG. 6, the RF power level could be given by the following table that covers all the possible combinations of PROX, OBJECT, and BODY.

TABLE 1

| PROX | OBJECT | BODY | RF Power |
| --- | --- | --- | --- |
| 0 | 0 | 0 | FULL (no object detected) |
| 1 | 0 | 0 | REDUCED (unknown type => could be user) |
| 1 | 0 | 1 | REDUCED (user detected) |
| 1 | 1 | 0 | FULL (inanimate object detected) |

Preferably, the filter 30 implements a non-linear noise suppression algorithm that will now be described with reference to FIG. 2. The entry point 305 is executed on all the raw samples R(k) generated by the ADC 25. The filter unit, which may include hardwired logic blocks, programmed logic, or any combination thereof.

The filter 30 is arranged to consider only the raw measurements R(k) that go systematically in the same direction, updating the output value U(k) when all the input samples R(k) in a predetermined time window are above or below the current output value U(k−1). If, on the other hand, the input values R(k) in the same time window are below and above U(k−1), the output value is not changed.

In a possible implementation, represented by the flow-chart of FIG. 2, the filter 30 computes and maintains two variables min(k) and max(k) that are the minimum and maximum values of R(k) in a window of N preceding samples (step 320)

$$\min(k) = \min_{i=0,\ldots,N-1} R(k-1)$$

$$\max(k) = \max_{i=0,\ldots,N-1} R(k-1)$$

where N is a selectable parameter that loosely determines the width of the filtering window. N could be comprised between 4 and 20, in typical implementations. Simulations with N=8 have provided satisfactory results both in noise reduction and sensitivity to small distance changes. N may be a predetermined value hardwired in the filter, a programmable quantity settable by a host system, or a dynamic value.

In steps 350 and 370, the values of min(k) and max(k) are compared with the last determination of the filter's output U(k−1) and, if it is found that U(k−1) is lower than the minimum value, or greater that the maximum value in the windowed samples R(k), . . . , R(k−N+1), the new value of U(k) is set to that minimum (step 362), respectively maximum (step 364). If neither of steps 350 and 370 is satisfied, the values R(k), . . . , R(k−N+1) are in part above and in part below U(k−1) and the output is not changed from the previous value (step 366). The cycle then repeats when a new successive value of R(k) is produced (step 305). The informed reader will appreciate that the initial value of U is not determined by these recursive steps, but can be generated in many ways when the filter is initialized, for example by setting U(0) equal to R(0), to a random value, or simply to zero.

FIG. 3 represents a simulation of the nonlinear filter of the invention. The line 145 is a plot of a simulated signal (a rectangular pulse) with a substantial amount of white noise superimposed. Line 149 plots the same signal after processing with a linear filter: a running average filter with window length N=8. Line 147, finally, shows the output of the filter of the invention also with a window length N=8. It will be appreciated that both the linear filter and that of the invention make the signal stand out of the noise, but the variability of the signal 147 is considerably lower than that of the linear filter 149.

This can be explained recalling that the standard deviation of the output of a linear filter decreases only with the square root of the window length (or pass bandwidth). The filter of the invention is arranged to strongly reduce the probability of output changes due to statistic fluctuations. Taking for example that a input R consisting of a constant value with superimposed noise, and supposing that a given instant the output U(k−1) is perfectly centred on the noise free value of R, then the successive output value U(k) will change only if N consecutive input samples lay on the same side of the central value; the probability of change is then $(½)^{N-1}$.

A peculiarity of the filter of the invention is that small transitory changes could produce no effect on the output, while output of a linear filter would have changed, however little. This may be regarded a drawback in some applications, although the output of the linear filter, consisting of a tiny signal overwhelmed by noise, may not be useful in practice.

An advantage of the filter of the invention is that it provides a strong reduction of the noise fluctuations in a simple algorithm. When the filter is applied to the proximity detector of FIG. 1, it is relatively simple finding a threshold value for the discriminator 50 that provides a reliable proximity trigger, with a minimum of false signals. This would be harder with a simple average. A linear average filter should, to achieve the same result, increase N and lengthen the extension of the window. This measure, however, would increase the computational burden, and reduce the bandwidth, hence the sensitivity to fast transients.

In the frame of the proximity detector of FIG. 1, the nonlinear filtering processor of the invention could replace totally the low pass filter block 30 or be used in combination with a linear digital filter, before or after. It could be inserted ahead of the baseline correction unit 40, 60, as represented, or also after.

FIG. 4 plots the noise reduction versus the number of samples, assuming input R consisting of a constant value with superimposed noise. The noise is plotted as the standard deviation of the output signal. The addressee will appreciate that, in the nonlinear filter of the invention 430, a decreases faster than in the average filter 410, which follows a $1/\sqrt{N}$ law.

The filter of the invention is capable of several improvements and adaptations. For example, in a variant, the U(n) may be changed not exactly to max(k), respectively min(k), but shifted towards the extreme value by a predefined fractional amount. For example, the updates in steps 362 and 362 could be replaced by:

$$U(k)=a\cdot\min(k)+(1-a)\cdot U(k-1)$$

$$U(k)=a\cdot\max(k)+(1-a)\cdot U(k-1)$$

where a denotes a predefined coefficient between 0 and 1.

According to another variant, the filter could compare the average change in the input signal with an expected spread of the measurement and update the output value only when the average change is larger than a predetermined fraction of the expected spread, thus significant.

REFERENCE NUMBERS USED IN THE FIGURES 20 electrode
23 analogue processor
25 A/D converter
30 filter
40 difference
50 discriminator
60 baseline estimator
90 receiver
105 new sample U(n)
120 estimation of the variation
122 test if proximity
130 test variation against lower and upper thresholds
135 test against inactive threshold
140 freeze variation
145 simulated signal
147 filter output
149 output of the linear filter
160 update baseline estimation
170 test A(n) against U(n)
180 cap A(n)
305 new R(x) value
320 compute and maintain max and min value
350 test filter output against min(k)
362 set to minimum
364 set to maximum
366 copy previous value
370 test filter output against max(k)
410 standard deviation of an averager
430 standard deviation of the invention's filter
630 approach of a body
650 approach of an inanimate object

The invention claimed is:

1. A portable connected device comprising a sensor arranged to determine whether a user is in proximity to the portable connected device, the sensor comprising a noise-reducing filter receiving a series of digital input values and generating a series of digital output values, wherein the filter is arranged to process input values in a window having a predetermined length time and to:
  update the output value shifting the output value towards the maximum of the input samples in the window when the current output value is above all the input samples in the time window, or
  update the output value shifting the output value towards the minimum of the input samples in the window when the current output value is below all the input samples in the time window, or
  repeat the current output value in all other cases.

2. The portable connected device of claim 1, wherein updating the output value includes shifting the output value by a predetermined fractional amount between 0 and 1.

3. The portable connected device of claim 1, wherein the output value is updated according to the formula $$U(k)=a \cdot \min(k)+(1-a) \cdot U(k-1) \text{ if } U(k-1)<\min(k)$$

$$U(k)=a \cdot \max(k)+(1-a) \cdot U(k-1) \text{ if } U(k-1)>\max(k)$$

where 'U(k)' denotes the output value, 'U(k−1)' the current output value, 'max (k)' and 'min(k)' the maximum, respectively minimum of the input values in the window, and 'a' a predetermined fractional amount between 0 and 1.

4. The portable connected device of claim 1, arranged to adapt a RF power of a radio transmitter based on the proximity of a user to the portable connected device.

5. The portable connected device of claim 1, wherein the noise-reducing filter is adapted to compare an average change of the input signal with an expected spread value and to update the output value only if the average change is larger than a predetermined fraction of the expected spread.

6. The portable connected device of claim 1, wherein the noise-reducing filter is arranged to compute a minimum value of the input values in the window and a maximum value of the input values in the window, to compare the minimum value and the maximum value with a current output value, and to:
update the output value to the minimum value if the current output value is less than the minimum value, or
repeat the previously-generated output value if the current output value is comprised between the minimum value and the maximum value, or
update the output value to the maximum value if the current output value is more than the maximum value.

7. The portable connected device of claim 1, comprising a linear low-pass filter.

8. The portable connected device of claim 1, comprising a baseline estimator arranged to read the output values and generate a series of estimated baseline values, and a subtraction unit arranged to subtract the estimated baseline values from the output values.

9. The portable connected device of claim 1, wherein the sensor determines a capacity seen by a sense electrode and decides whether a user is in proximity based on the capacity.

10. The portable connected device of claim 6, wherein the sense electrode is also an emitter of radio waves.

* * * * *